United States Patent [19]

Harrison

[11] 4,255,668
[45] Mar. 10, 1981

[54] PULSED POWER SUPPLIES
[75] Inventor: Colin G. Harrison, High Wycombe, England
[73] Assignee: EMI Limited, Hayes, England
[21] Appl. No.: 22,168
[22] Filed: Mar. 20, 1979
[30] Foreign Application Priority Data

Mar. 30, 1978 [GB] United Kingdom ............... 12532/78

[51] Int. Cl.³ .............................................. H03K 3/55
[52] U.S. Cl. ...................... 307/107; 328/61; 328/65
[58] Field of Search ................................ 307/106–108; 323/44 R, 48; 328/60–63, 65, 67, 75

[56] References Cited

U.S. PATENT DOCUMENTS

| 3,051,906 | 8/1962 | Haynes | 328/67 X |
|---|---|---|---|
| 3,411,107 | 11/1968 | Rees | 328/67 X |
| 3,772,601 | 11/1973 | Smith | 328/65 |
| 3,786,334 | 1/1974 | Johannessen | 307/107 X |
| 4,001,598 | 1/1977 | Johannessen | 307/106 |
| 4,082,965 | 4/1978 | Hornbeck et al. | 328/61 X |
| 4,087,705 | 5/1978 | Barnes | 328/67 X |
| 4,099,128 | 7/1978 | Hooper | 328/65 |

FOREIGN PATENT DOCUMENTS

1127251  9/1968  United Kingdom ...................... 328/67

Primary Examiner—A. D. Pellinen
Attorney, Agent, or Firm—Cooper, Dunham, Clark, Griffin & Moran

[57] ABSTRACT

A pulsed power supply for driving an X-ray tube is described. Four p.f.n. devices are coupled in pairs to respective transformers and the individual devices supply pulses of relatively short duration to their respective transformers. Each pulse supplied by one device is followed by a pulse supplied by a device of the other pair, and pulses supplied by all of the devices in sequence are combined to produce a pulse of relatively long duration for application to the tube.

6 Claims, 1 Drawing Figure

U.S. Patent
Mar. 10, 1981
4,255,668
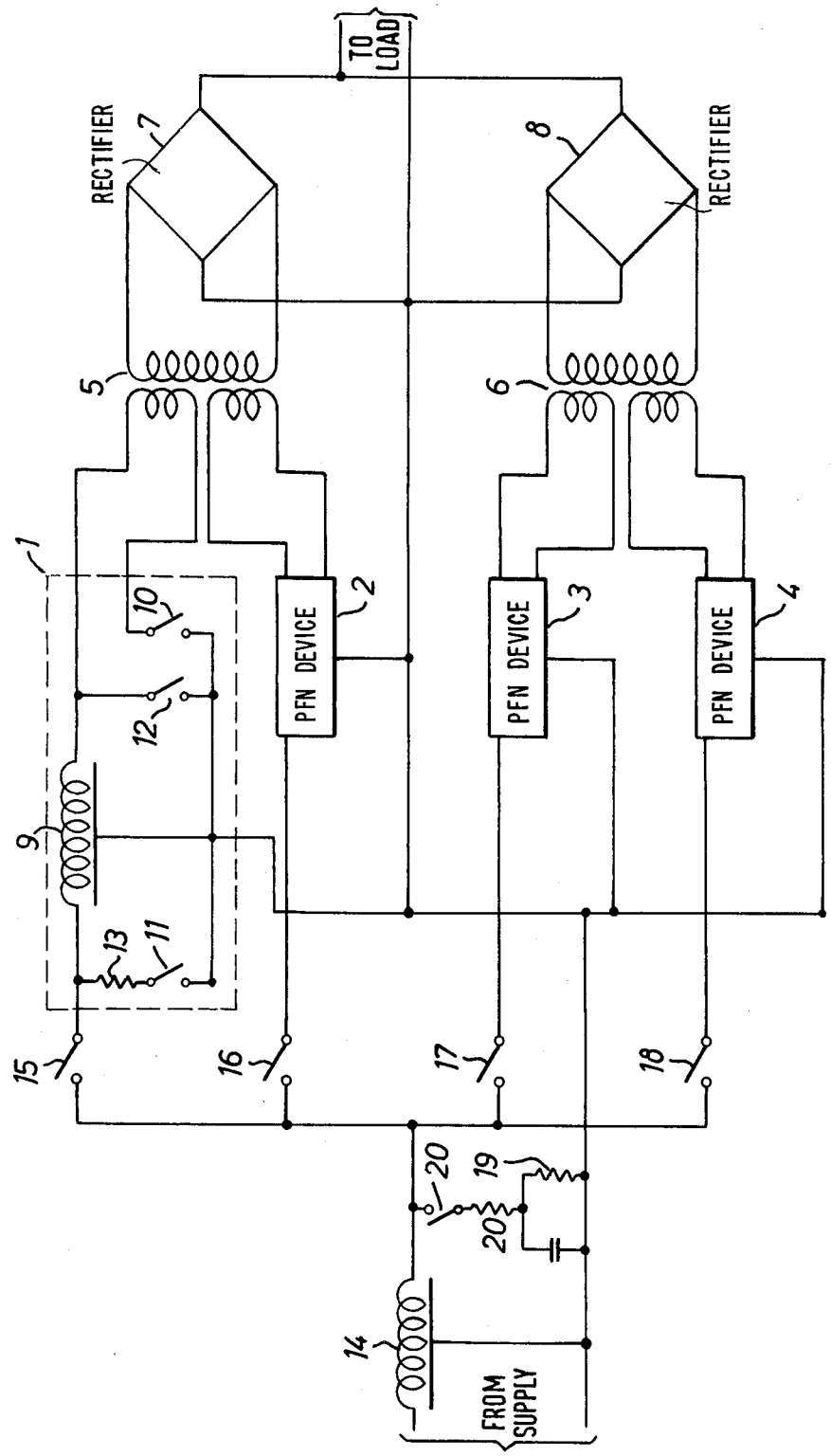

PULSED POWER SUPPLIES

The present invention relates to pulsed power supplies and it relates especially, though not exclusively, to such supplies for X-ray generating tubes. It is a requirement for X-ray generating tubes utilised in some recently developed forms of radiographic apparatus, for example computerised tomographic apparatus, that the electron gun of the X-ray tube be supplied with a pulsed current of five amperes for 10–20 ms at a cathode potential of $-140$ kV.

Such requirements place considerable demands upon the power supplies used to feed the X-ray tube and to attempt to satisfy the requirements by conventional high voltage power supply techniques results in the need for excessively large and heavy high voltage transformers.

This invention has the object of providing a power supply which can meet the above requirements without the attendant disadvantages of conventional techniques.

The production of high voltage pulses of short duration (i.e. 10–50 $\mu$s) by means of a pulse-forming network (p.f.n.), or a delay line, is well known. However, the application of such devices to the problem in hand is inhibited because of the need to extend the pulse duration by the order of a thousand times, and this would involve re-charging the device repeatedly in a time comparable to its own delay time.

An additional problem arising with an attempt to use such a device to produce high voltage pulses of 10–20 ms by the sequential production of pulses of a few microseconds in duration is that, at the end of each of the individual shorter pulses, the core of a transformer used to couple the voltage produced by the device, with a step-up, to the X-ray tube, becomes strongly magnetised. In order that a second pulse can be usefully applied to the transformer sufficiently soon after the termination of the first pulse so that the effect of a continuous pulse of longer duration is achieved, it is necessary that the second pulse be of opposite polarity to the first, so as to magnetize the core in the opposite sense. This can be achieved by using two devices, coupled to the transformers in opposing senses, and causing the two devices to discharge alternately to the transformer. A problem with this expedient, however, is that the application of a positive pulse to the primary transformer winding associated with one of the devices induces a negative voltage in the primary transformer winding associated with the other device. If the devices are operated in rapid succession, as is required, switch components used to control one of the devices can be damaged by the inverse induced voltage associated with the operation of the other device, because little recovery time is available for the switch components.

In order to reduce the difficulties referred to above, the invention provides a pulsed power supply comprising at least four p.f.n. or delay line devices coupled in pairs to respective transformers and switchable means for controlling the said devices so that the individual devices supply pulses of relatively short duration to their respective transformers, each pulse supplied by a device of one of said pairs being followed by a pulse supplied by a device of the other of said pairs and the devices of a pair supplying pulses alternately to the respective transformer, and means for combining the energy supplied to said transformer by all of said devices during many cycles of operation thereof to produce a pulse of relatively long duration for application to a load.

In order that the invention may be clearly understood and readily carried into effect, one embodiment thereof will now be described, by way of example only, with reference to the accompanying drawing, the single FIGURE of which shows, in diagrammatic form, a pulsed power supply in accordance with one example of the invention.

In the example of the invention shown in the drawing, four p.f.n. devices 1–4, providing pulses of relatively short duration, are used, these devices being coupled inversely, in pairs, to respective transformers 5 and 6. Output pulses from the two transformers are rectified, in respective rectifier circuits 7 and 8 of conventional kind, and combined for application to a load (not shown) which would typically be constituted by an X-ray tube.

Only one of the p.f.n. devices, 1, is shown in detail as they are all similar to one another. The p.f.n. device 1 has a characteristic impedance $z_o$ and includes a delay line 9 having a go-and-return transit time of $2\tau$ microseconds. If the device 1 is assumed to be charged initially to a voltage $2V_o$, then at starting time $t=0$, a switch 10, constituted by a hydrogen thyratron, is closed, causing the device 1 to commence discharging. A pulse which rises rapidly to a voltage amplitude $V_o$ is applied to the transformer 5 and is transformed thereby for application to the X-ray tube (not shown) which acts as a matched load.

When the switch 10 is closed, a travelling pulse of voltage $-V_o$ is propagated back along the delay line. In order to reduce ringing effects following the termination of the pulse, and to thereby sharpen the trailing edge of the pulse, two further switches 11 and 12 are provided and actuated at appropriate times. Switch 11 is closed at some time $t_2$, where $0<t_2<\tau$, causing another pulse of voltage $-V_o$ to propagate forwards along the delay line. This pulse will reach the output end of the delay line at time $t_2+\tau$ causing the output voltage to fall to zero at that time, instead of the later time $2\tau$, which is when the output voltage would have fallen to zero in the absence of the pulse introduced by the actuation of switch 11. The trailing edge of the pulse provided by the device 1 is sharpened by closing the switch 12 at a time $\delta$ microseconds before the time $t_2+\tau$.

Switch 11 is refered to as the "dump switch" and its associated resistor 13 is called the "dump resistor". Switch 12 is called the "clipper switch".

As mentioned previously, at the end of a single pulse, the transformer core is strongly magnetised and, left to itself, this magnetisation will decay rather slowly to some remanent value, incidentally inducing small negative voltage in the windings. However, the transformer can be re-used quickly by applying a pulse giving the opposite magnetisation. This gives a kind of push-pull drive and enables full use of the core. The secondary rectifier produces the correct output polarity in both cases.

This technique is used in the arrangement shown in the drawing, but a problem exists in that applying a positive voltage to one primary winding induces a negative voltage in the other. If pfn 2 were discharged immediately after pfn 1, switches 10 and 12 of pfn 1 would tend to break down spontaneously because they require a certain time, typically tens of microseconds, to recover their hold-off characteristics.

To produce substantially continuous pulse trains, this example of the invention provides for the use of two such systems with their 140kV outputs in parallel. Here pfn 1 is operated first, then pfn 3, then pfn 2 etc. Each pfn thus has a period of $2\tau$ after the end of its own discharge before it is subjected again to forward bias.

A problem associated with the circuit shown in the drawing is that of charging each pfn about 250 times during a 10–20 ms period. The direct approach involving the use of a high voltage dc power supply capable of recharging each pfn during its recovery period would result in a system comparable with the 140 kV dc supply referred to earlier, with its attendant disadvantages. An alternative would be 1000 small energy storage banks and resonant charge transfer circuits. This method leads to very large numbers of capacitors, charge transfer switches (thyratrons or thyristors), etc.

In the arrangement shown in the drawing, the above-mentioned problem is solved by using a 10–20 ms pfn 14 of the same impedance $z_o$, the output of which is switched successively between each of the four pfn's 1–4 feeding the transformer. The pfn 14 thus stores the primary energy for the 10–20 ms burst (about 14 kJ) and is able to deliver a continuous charging current (about 180A) so as to recharge each of the pfns 1–4 during a time $2\tau$. The 20 ms pfn 14 is connected sequentially to each of the pfn's 1–4 via a respective fast-recovery thyratron 15–18, starting a $+V_o$ wave up the pfn which is reflected at the non-conducting main switch (such as 10—also a fast-recovery thyratron) and at a time $2\tau$ after the connection the pfn is charged to $2V_o$. This puts the charging thyratron 15–18 momentarily into reverse bias, but unless the 20 ms pfn 14 is immediately connected to another pfn, i.e. unless its output current is diverted, the output voltage will rise to $2V_o$ and a $+V_o$ wave will be launched backwards along the 20 ms pfn. This imposes stringent timing requirements on the sequential switching of the charging current. To ease this, a snubber circuit 19 on the output of the 20 ms pfn 14 can briefly absorb the current during the change-over between the pfns 1–4. This circuit 19 uses the current to charge a small capacitor through a matched load. The capacitor is subsequently discharged in time for the next switching operation. This involves wasting some power but gives switching lattitude of 1–2 $\mu s$. Nonetheless stringent timing control is required.

The operating sequence is as follows (PFN is assumed to be initially charged):

| | | |
|---|---|---|
| $t = 0$ | PFN 1 | discharge |
| | PFN 3 | charging starts |
| $t = 2\tau$ | PFN 1 | discharge stops |
| | PFN 3 | charging stops |
| | PFN 3 | discharge starts |
| | PFN 2 | charging starts |
| $t = 4\tau$ | PFN 3 | discharge stops |
| | PFN 2 | charging stops |
| | PFN 2 | discharge starts |
| | PFN 4 | charging starts |
| $t = 6\tau$ | PFN 2 | discharge stops |
| | PFN 4 | charging stops |
| | PFN 4 | discharge starts |
| | PFN 1 | charging starts | and so on.

The main switch 10 of PFN 1 performs this cycle:

| | |
|---|---|
| $t = 0$ | Passing current |
| $t = 2\tau$ | Turn-off + zero bias. |
| $t = 4\tau$ | Forward biased by induced voltage $-V_0$ from PFN 2 discharge. |
| $t = 6\tau$ | Zero bias. |
| $t = 7\tau$ | Forward biased $2V_0$ after arrival of charging wave. |
| $t = 8\tau$ | Passing current. |

Each discharge switch thus passes current for 25% of the burst, has zero bias for $2\tau$ (about 10–20 $\mu S$) to recover to withstand $V_O$, which it experiences for 10–20 $\mu S$, followed by $\tau$ (i.e. 5–10 $\mu S$) of zero bias and then $\tau$ of $2V_o$ forward bias. The charging switch 15 of PFN 1 performs this cycle:

| | |
|---|---|
| $t = 0$ | Zero current + zero bias. |
| $t = \tau$ | Forward biased $2V_0$ after passage of discharge wave. |
| $t = 6\tau$ | Passing current. |
| $t = 8\tau$ | Zero current + zero bias. |

Each charging switch thus passes current for 25% of the burst, has zero bias for $\tau$ (i.e. 5–10 $\mu S$) to recover to withstand $2V_O$ which it then experiences for $5\tau$ (i.e. 25–50 $\mu S$).

The snubber switch 20 passes current for 1–2 $\mu S$ after which it turns off and experiences a rising forward bias as the capacitor discharges. The capacitor discharge could be performed by another fast-recovery thyratron in which case could have a recovery time of about $\tau$.

The charging of the 20 ms pfn 14 can be performed slowly, there being typically 20s between bursts. It should be performed by a current-controlled hv dc power supply (not shown) with about a 2 kW rating.

The arrangement described exhibits the following advantages compared with a conventional high-voltage d.c. supply:

1. The maximum power drawn from the mains supply has been reduced from 700 kW to 2 kW plus auxiliaries (2 kW).
2. The power supply can occupy an area less than 20 m$^2$ and requires no special access conditions.
3. Since the burst can be stopped within $2\tau$ (i.e. about 10–20 $\mu S$), the energy liable to be deposited in the X-ray tube by an arc is limited to 10–20J.
4. Because of the notch between pulses in the output voltage, the tube can safely be gated off without risk of over voltage surges.
5. Because of the very short pulse, the 140 kV transformers will be quite small and may be mounted very close to the X-ray gun.

What I claim is:

1. A pulsed power supply comprising at least four pulse forming network (or delay line) devices coupled in pairs to respective transformers and switchable means for controlling said devices so that the individual devices supply pulses of relatively short duration to their respective transformers, the pulses supplied by the devices of one of said pairs being interleaved in time with the pulses supplied by the devices of the other pair and the devices of a pair supplying pulses alternatively to the respective transformer, and means for combining the energy supplied to said transformer by all of said devices during many cycles of operation thereof to produce a pulse of relatively long duration for application to a load.

2. A supply according to claim 1 wherein said means for combining comprises a respective rectifier means associated with each transformer; the output connections of the rectifier means being commoned.

3. A supply according to claim 1 wherein said switchable means comprises a respective switch connected in the path from each of said devices to its respective transformer; each said switch being constituted by a fast-recovery hydrogen thyratron.

4. A supply according to any of claims 1–3 wherein, associated with each of said devices, there is provided a respective pair of switches for pulse sharpening; one of said switches shunting the input of the corresponding device and the other of said switches shunting the output of said device.

5. A supply according to claim 1 wherein a further pulse forming network is provided and connected to the inputs of all of said at least four devices through individual switches.

6. A supply according to claim 5 including a switchable snubber arrangement shunting the output of said further network.

* * * * *